(12) United States Patent
Kwon et al.

(10) Patent No.: US 10,157,969 B2
(45) Date of Patent: Dec. 18, 2018

(54) DISPLAY DEVICE HAVING A BENDING REGION

(71) Applicant: SAMSUNG DISPLAY CO., LTD., Yongin-si, Gyeonggi-do (KR)

(72) Inventors: Tae Hoon Kwon, Yongin-si (KR); Won Kyu Kwak, Seongnam-si (KR); Kwang-Min Kim, Seoul (KR); Hey Jin Shin, Cheonan-si (KR); Seung-Kyu Lee, Asan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/628,299

(22) Filed: Jun. 20, 2017

(65) Prior Publication Data
US 2017/0365650 A1      Dec. 21, 2017

(30) Foreign Application Priority Data
Jun. 20, 2016 (KR) .......................... 10-2016-0076879

(51) Int. Cl.
  *H01L 27/00*     (2006.01)
  *H01L 27/32*     (2006.01)
  *H01L 51/00*     (2006.01)

(52) U.S. Cl.
  CPC ...... *H01L 27/3253* (2013.01); *H01L 27/3276* (2013.01); *H01L 27/3288* (2013.01); *H01L 27/3297* (2013.01); *H01L 51/0097* (2013.01); *H01L 2251/5338* (2013.01); *Y02E 10/549* (2013.01)

(58) Field of Classification Search
  CPC .................................................. H01L 27/3253
  See application file for complete search history.

(56) References Cited

U.S. PATENT DOCUMENTS

| | | | |
|---|---|---|---|
| 6,603,710 B1 | 8/2003 | Pantet et al. | |
| 2005/0237467 A1* | 10/2005 | Takaishi | G02F 1/13452 349/149 |
| 2006/0223346 A1* | 10/2006 | Fujii | G06F 3/041 439/76.2 |

(Continued)

FOREIGN PATENT DOCUMENTS

| | | |
|---|---|---|
| EP | 1079259 A1 | 2/2001 |
| EP | 2275861 A1 | 1/2011 |

(Continued)

OTHER PUBLICATIONS

Extended European Search Report dated Nov. 17, 2017 for Application No. 17176785.8.

*Primary Examiner* — William Harriston
(74) *Attorney, Agent, or Firm* — F. Chau & Associates, LLC

(57) ABSTRACT

A display device includes a substrate having a first region in which an image is displayed, a second region in which an image is not displayed, and a bending region connecting the first region and the second region. The bending region is configured to bend along a bending axis which extends in a first direction. A plurality of pad terminals is disposed within the second region. A first width of the bending region, measured along the first direction, is narrower than a second width of the second region, measured along the first direction.

31 Claims, 16 Drawing Sheets

(56) References Cited

U.S. PATENT DOCUMENTS

2013/0056243 A1* 3/2013 Kim .................... H05K 1/0289
                                                              174/250
2014/0254111 A1    9/2014  Yamazaki et al.
2016/0007441 A1    1/2016  Matsueda
2016/0161781 A1    6/2016  Chiu et al.

FOREIGN PATENT DOCUMENTS

| EP | 2626904 A2 | 8/2013 |
| EP | 3057084 | 8/2016 |
| EP | 3070572 A1 | 9/2016 |
| KR | 10-2014-0108827 | 9/2014 |
| KR | 10-2015-0015268 | 2/2015 |
| WO | 2016059514 | 4/2016 |

\* cited by examiner

DISPLAY DEVICE HAVING A BENDING REGION

CROSS-REFERENCE TO RELATED APPLICATION

This application claims priority to and the benefit of Korean Patent Application No. 10-2016-0076879 filed, in the Korean Intellectual Property Office, on Jun. 20, 2016, the entire contents of which are herein incorporated by reference.

TECHNICAL FIELD

The present disclosure relates to a display device, and more particularly, to a non-quadrangular display device having a bending region.

DISCUSSION OF THE RELATED ART

Display devices include a liquid crystal display (LCD), a plasma display panel (PDP), an organic light emitting diode (OLED) display, a field effect display (FED), an electrophoretic display device, and the like.

Particularly, the OLED display includes two electrodes and an organic emission layer positioned therebetween. Electrons are injected from one electrode and holes are injected from the other electrode. The injected electrons and holes are joined with each other in the organic emission layer to generate excitons, and the excitons emit energy in the form of light.

The OLED display is self-luminating and therefore does not require a separate light source. Accordingly, OLED displays may be thinner and lighter than LCDs, which require separate light sources. Also, the OLED display has relatively low power consumption, high luminance, and a high response speed.

SUMMARY

A display device includes a substrate having a first region in which an image is displayed, a second region in which an image is not displayed, and a bending region connecting the first region and the second region. The bending region is configured to bend along a bending axis which extends in a first direction. A plurality of pad terminals is disposed within the second region. A first width of the bending region, measured along the first direction, is narrower than a second width of the second region, measured along the first direction.

A display device includes a first region of a display substrate in which an image is displayed and a second region of the display substrate in which a plurality of pad terminals is disposed. A bending region connects the first region and the second region. The display substrate is configured for bending within the bending region such that the second region is folded in towards the first region. The first region is substantially rounded in shape such as a circular shape or an oval shape, and an average width of the bending region is less than an average width of the second region.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Figure 1:
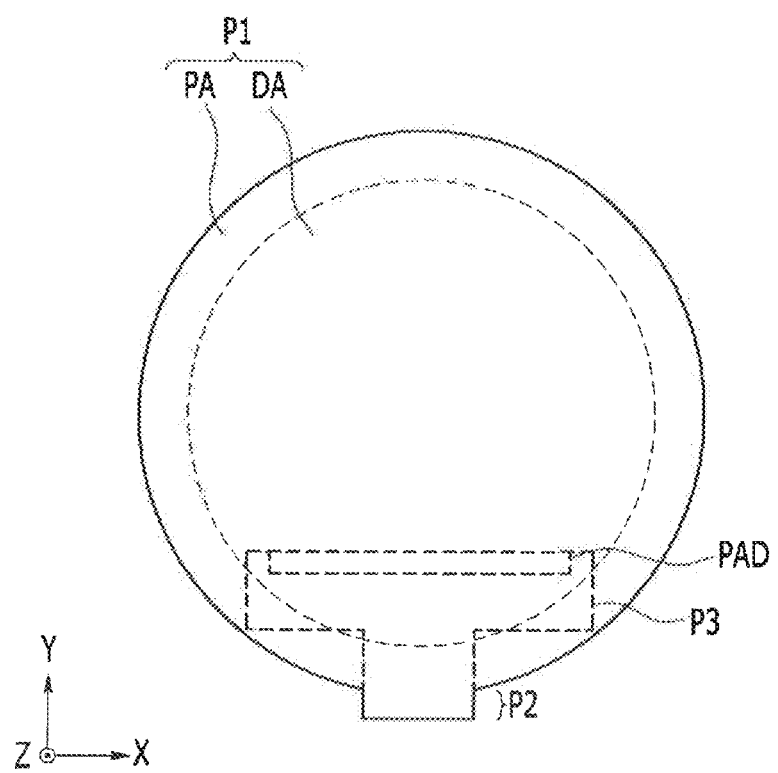
FIG. 1 is a schematic top plan view of a display device according to an exemplary embodiment of the present invention.

Hereinafter, exemplary embodiments of the present invention will be described in detail with reference to the attached drawings. The described exemplary embodiments may be modified in various different ways, all without departing from the spirit or scope of the present disclosure. Like reference numerals may designate like elements throughout the specification.

In the drawings, the thickness of layers, films, panels, regions, lines, etc., may be exaggerated for clarity. It will be understood that when an element such as a layer, film, region, or substrate is referred to as being "on" another element, it can be directly on the other element or intervening elements may also be present.

Now, a display device according to an exemplary embodiment of the present invention will be described with reference to FIG. 1 to FIG. 8.

Figure 2:
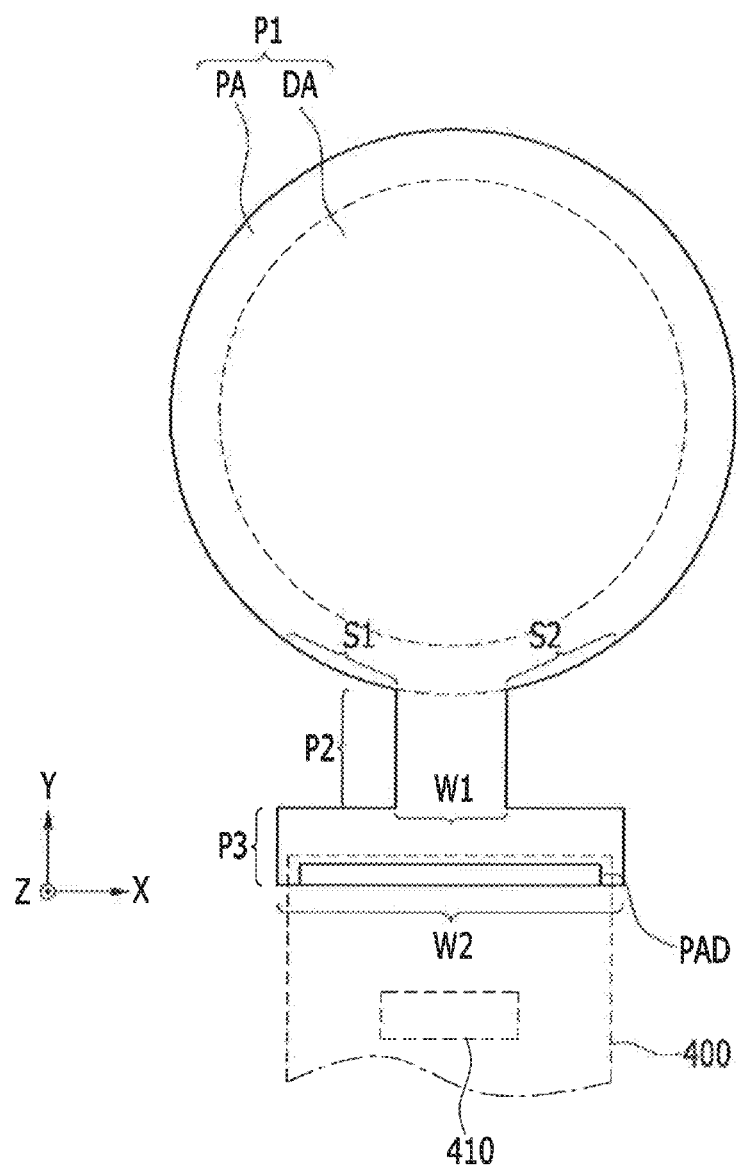
FIG. 2 is a top plan view of an unfolded state of a substrate of a display device of FIG. 1.
Figure 3:
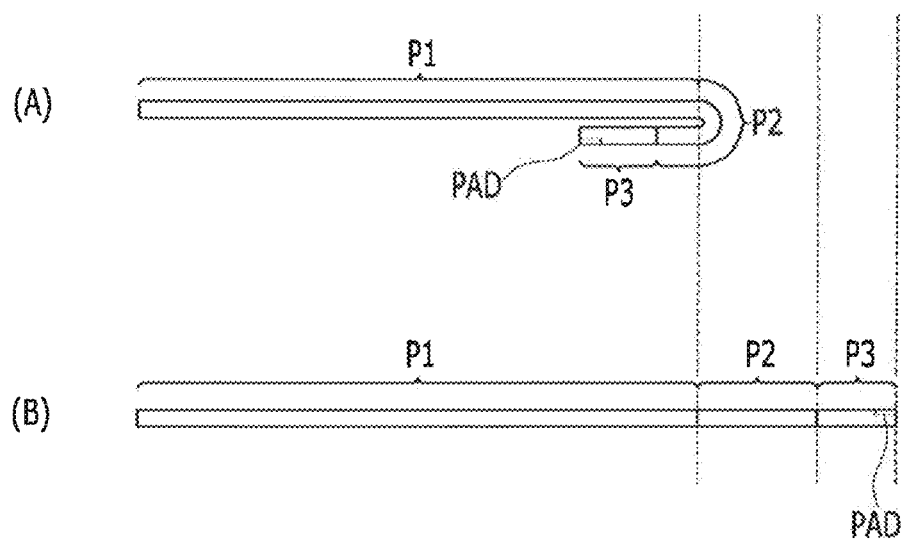
FIGS. 3 (A) and (B) are side views of a display device of FIG. 1 and FIG. 2, respectively.
Figure 4:
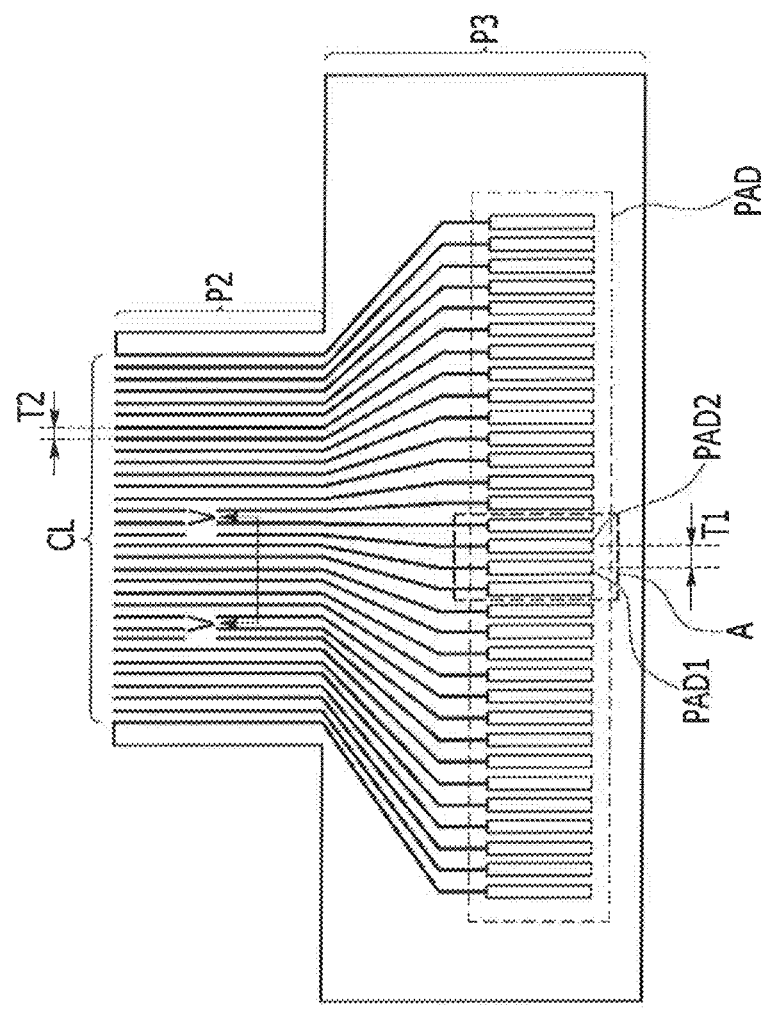
FIG. 4 is a view of a pad terminal and a connection wire disposed in a bending region and a pad region according to an exemplary embodiment of the present invention.
Figure 5:
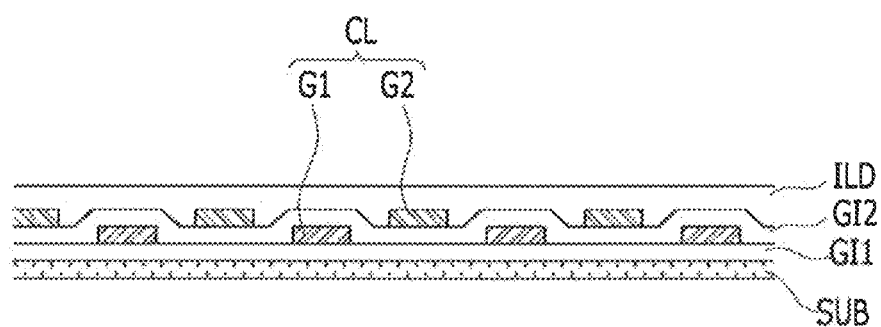
FIG. 5 is a cross-sectional view taken along a line V-V of FIG. 4.
Figure 6:
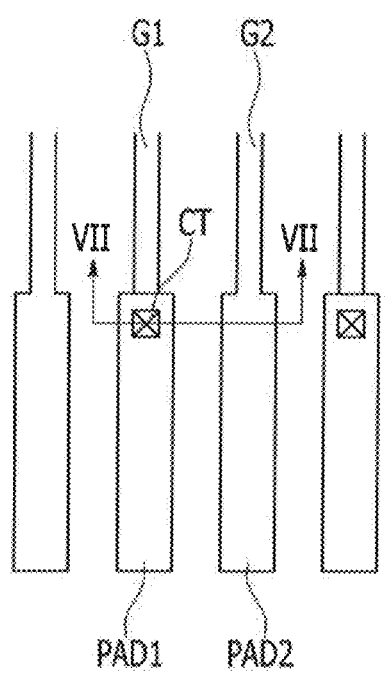
FIG. 6 is an enlarged view of a region A of FIG. 4.
Figure 7:
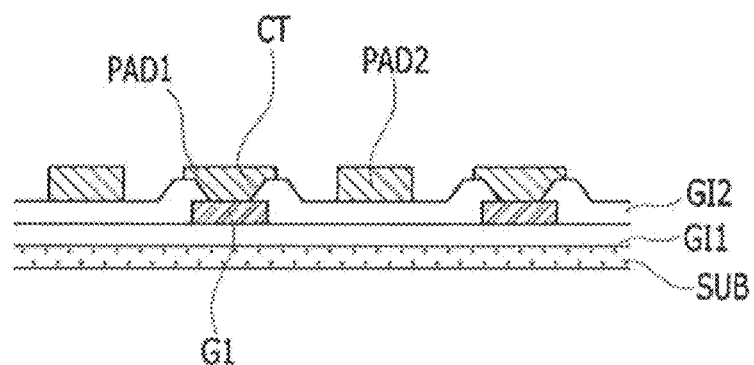
FIG. 7 is a cross-sectional view taken along a line VII-VII of FIG. 6.
Figure 8:
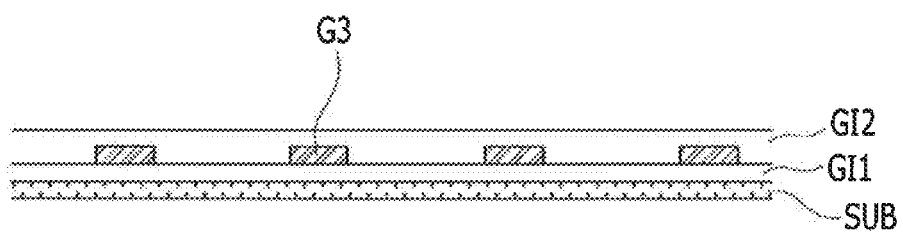
FIG. 8 is a view of a variation of a connection wire of FIG. 5 according to an exemplary embodiment of the present invention.

FIG. 1 is a schematic top plan view of a display device according to an exemplary embodiment of the present invention. FIG. 2 is a top plan view of an unfolded state of a substrate of a display device of FIG. 1. FIGS. 3 (A) and (B) are side views of a display device of FIG. 1 and FIG. 2, respectively. FIG. 4 is a view of a pad terminal and a connection wire disposed in a bending region and a pad region. FIG. 5 is a cross-sectional view taken along a line V-V of FIG. 4. FIG. 6 is an enlarged view of a region A of FIG. 4. FIG. 7 is a cross-sectional view taken along a line VII-VII of FIG. 6. FIG. 8 is a view of a variation of a connection wire of FIG. 5 according to an exemplary embodiment of the present invention.

Referring to FIG. 1 to FIG. 8, a display device according to an exemplary embodiment of the present invention may include a substrate SUB, a plurality of pad terminals PAD, and a flexible circuit board 400. A bending region P2 connecting a first region (hereinafter, a display region P1) and a second region (hereinafter, a pad region P3), positioned on the substrate SUB, is bent along an axis extending in a first direction (an X-axis direction in the drawings) such that the pad region P3 may overlap the display region P1. Also, a first width W1 of the bending region P2 may be smaller than a second width W2 of the pad region P3.

Referring to FIG. 1, the display device according to an exemplary embodiment of the present invention may include the display region P1, the bending region P2, and the pad region P3. The display region P1, the bending region P2, and the pad region P3 may be positioned on the substrate SUB.

The display region P1 may be a region displaying an image. The display region P1 may be divided into a display area DA and a periphery area PA. A display panel 100 (referring to FIG. 9), which emits light, may be positioned within the display area DA. Also, a plurality of connection wires CL (referring to FIG. 4), which may drive the display panel 100, may be positioned within the periphery area PA. Hereafter, some of the components formed on the substrate SUB will be described. It is to be understood, however, that additional components, not described herein, may also be formed on the substrate SUB.

First, the display panel 100 formed in the display area DA of the substrate SUB will be described with reference to FIG. 9 and FIG. 10.

Figure 9:
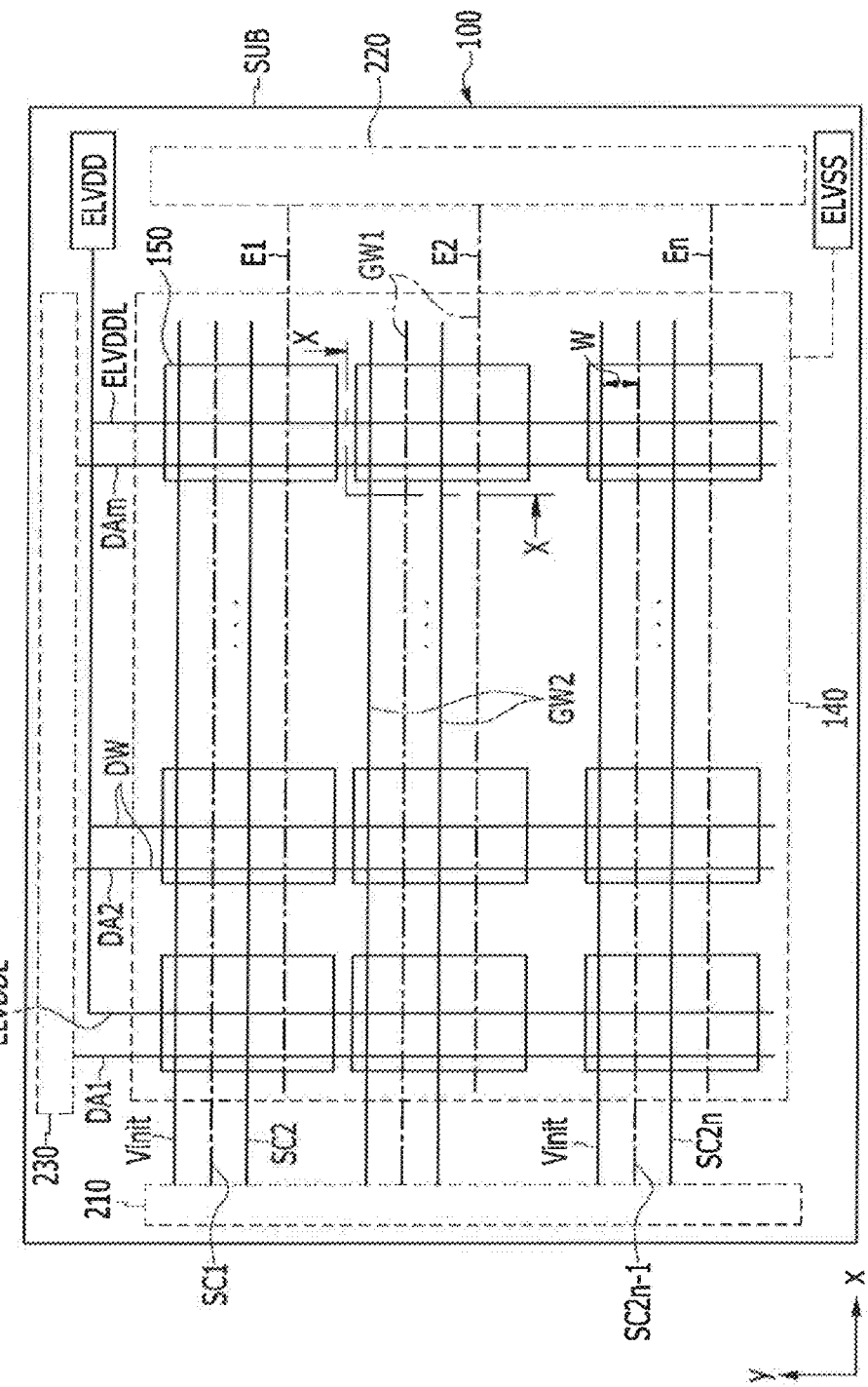
FIG. 9 is a schematic view of the display area of FIG. 1.
Figure 10:
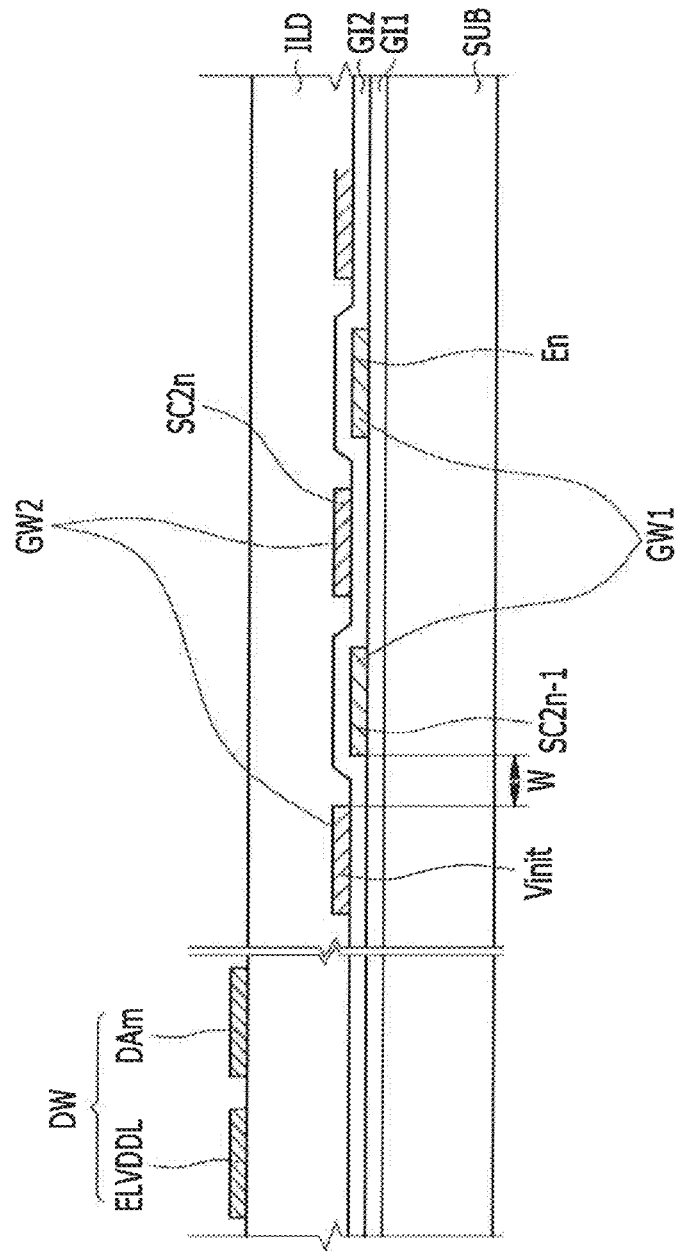
FIG. 10 is a cross-sectional view taken along a line X-X of FIG. 9.

FIG. 9 is a schematic view of the display area of FIG. 1, and FIG. 10 is a cross-sectional view taken along a line X-X of FIG. 9.

According to an exemplary embodiment of the present invention, the display panel 100 includes first gate wires GW1, second gate wires GW2, data wires DW, a display part 140, and a pixel 150.

A gate driver 210 receives a control signal from an external control circuit, such as a timing controller. The gate driver 210 sequentially supplies a scan signal to a first scan line SC2-SC2n or a second scan line SC1-SC2n−1 included in the first gate wires GW1 or the second gate wires GW2. Here, n is a positive integer.

Thus, the pixel 150 is selected by the scan signal and is sequentially supplied with a data signal. Here, the gate driver 210 may be disposed in a first driving chip 410 on the flexible circuit board 400.

The first gate wires GW1 are positioned on the substrate SUB with the first insulating layer GI1 interposed therebetween, and the first gate wires GW1 extend in the first direction (e.g. X-axis direction). The first gate wires GW1 include a second scan line SC2n−1 and an emission control line En.

The second scan line SC2n−1 is connected to the gate driver 210 and is supplied with the scan signal from the gate driver 210. The emission control line En is connected to an emission control driver 220 and is supplied with the emission control signal from the emission control driver 220. Here, the emission control driver 220, like the gate driver 210, may be disposed in the first driving chip 410 on the flexible circuit board 400.

The second gate wires GW2 are disposed on the first gate wires GW1 with the second insulating layer GI2 interposed therebetween. The second gate wires GW2 extend in the first direction. The second gate wires GW2 include the first scan line SC2n and an initialization power line Vinit.

The first gate wires GW1 and the second gate wires GW2 do not overlap each other.

The first scan line SC2n is connected to the gate driver 210 and is supplied with the scan signal from the gate driver 210. The initialization power line Vinit is connected to the gate driver 210 and is applied with initialization power from the gate driver 210.

In an exemplary embodiment of the present invention, the initialization power line Vinit receives initialization power from the gate driver 210. The initialization power line Vinit may additional be connected to another component and the initialization power may be applied to the initialization power line Vinit from this other component.

The emission control driver 220 sequentially supplies the emission control signal to the emission control line En in response to the control signal, which is provided from an external source such as the timing controller. Thus, the emission of the pixel 150 is controlled by the emission control signal.

For example, the emission control signal controls an emission time of the pixel 150. However, the emission control driver 220 may be omitted according to some pixel 150 structures.

A data driver 230 supplies the data signal to the data line Dam, among the data wires DW, in response to the control signal supplied from an external source, such as the timing controller. The data signal supplied to the data line Dam is supplied to the pixel 150, selected by the scan signal, whenever the scan signal is supplied to the first scan line SC2n or the second scan line SC2n−1. Thus, the pixel 150 is charged to the voltage corresponding to the data signal and light is emitted from the pixel with a luminance corresponding to the data signal voltage. Here, the data driver 230 may be disposed in the first driving chip 410 on the flexible circuit board 400, as is the gate driver 210.

The data wires DW are disposed on the second gate wires GW2 via the third insulating layer ILD interposed therebetween and extend in the second direction crossing the first direction. The data wires DW include a data line DA1-DAm and a driving power line ELVDDL. The data line Dam is connected to the data driver 230 and is supplied with the data signal from the data driver 230. The driving power line ELVDDL is connected to an external first power source ELVDD, and the driving power line ELVDDL is supplied with the driving power from the first power source ELVDD.

In this case, the driving power line ELVDDL and the data line Dam may be formed as part of the same layer on the third insulating layer ILD. However, the present invention is not limited thereto, and the driving power line ELVDDL and the data line Dam may be formed as part of different layers.

For example, the driving power line ELVDDL may be formed as part of the same layer as the first gate wire GW1, and the data line Dam may be formed as part of the same layer as the second gate wire GW2. In contrast, the driving power line ELVDDL may be formed as part of the same layer as the second gate wire GW2 and the data line DAm may be formed as part of the same layer as the first gate wire GW1.

The display part 140 includes a plurality of pixels 150 positioned where the first gate wires GW1, the second gate wires GW2, and the data wires DW cross. Here, each pixel 150 includes an organic light emitting element that emits light with a luminance corresponding to a driving current of the data signal. A pixel circuit controls the driving current flowing to the organic light emitting element.

The pixel circuit is connected to the first gate wires GW1, the second gate wires GW2, and the data wires DW. The organic light emitting element is connected to the pixel circuit. The pixel 150 is described as an organic light emitting element, however the pixel 150 of the display device according to exemplary embodiments of the present invention is not limited thereto, and the pixel 150 may be a liquid crystal display element or an electrophoretic display element.

The organic light emitting element of the display part 140 is connected to the external first power source ELVDD with the pixel circuit interposed therebetween, and the organic light emitting element is also connected to a second power source ELVSS. The first power source ELVDD and the second power source ELVSS respectively supply the driving power and the common power to the pixel 150 of the display part 140. The pixel 150 emits light with a luminance corresponding to the driving current from the first power source ELVDD, through the organic light emitting element, in response to the data signal which depends on the driving power and the common power supplied to the pixel 150.

As described above, in the display device, according to an exemplary embodiment of the present invention, the first gate wires GW1 and the second gate wires GW2 are disposed transverse to the pixel 150 in the first direction. The first and second gate wires GW1 and GW2 do not overlap each other and are not formed within the same layer, but rather, the first gate wires GW1 and the second gate wires GW2 are respectively disposed within different layers. The second insulating layer GI2 may be disposed between the first and second gate wires GW1 and GW2. Accordingly, a distance W between the gate wires adjacent to each other may be decreased, thereby forming more pixels 150 within the same area. For example, the high resolution display device may be formed.

Referring to FIG. 1 and FIG. 2, according to exemplary embodiments of the present invention, the substrate SUB may have a plane shape in which at least part of an edge thereof is rounded in the display region P1. For example, the edge of the display region P1, which is adjacent to the bending region P2, may be made with the rounded shape.

For example, in FIG. 2, the edges S1 and S2 of the display region P1 may be made with the rounded shape. In this case, when the substrate SUB has the circular or oval plane shape, the edges S1 and S2 of the display region P1 may correspond to the rounded shape.

Where the substrate SUB has a circular plane shape in the display region P1, the display area DA and the periphery area PA may have the circular plane shape. Here, the edge of the display area DA may be formed with the circular shape, and the edge of the periphery area PA enclosing the display area DA may also be formed with the circular shape.

In the display area DA, a plurality of pixels 150 are disposed in the display panel 100, and some of the plurality of pixels 150 may be disposed along the edge of the display area DA. As described above, the plurality of signal lines such as the data line Dam and the scan line SCn in the display panel 100 may be disposed in the display area DA. For example, the plurality of signal lines may transmit the scan signal or the data signal.

Alternatively, a plurality of connection wires CL (referring to FIG. 4) connected to the plurality of signal lines may be disposed in the periphery area PA. The plurality of connection wires CL may be connected to a plurality of pad terminals PAD of the pad region P3 through the bending region P2.

The bending region P2 is disposed between the display region P1 and the pad region P3 and connects the display region P1 and the pad region P3 to each other. The substrate SUB is bent in the bending region P2, and the pad region P3 may be disposed at the rear surface of the display region P1. For example, the pad region P3 may overlap the display region P1.

Referring to FIG. 2, in the state that the substrate SUB is unfolded, the display region P1, the bending region P2, and the pad region P3 are arranged in the stated order in the second direction (e.g. the Y-axis direction). If the bending region P2 is bent along the axis extending in the first direction (e.g. the X-axis), as shown in FIG. 1, the pad region P3 may be disposed at the rear surface of the display region P1. Accordingly, the pad region P3 and the display region P1 may be disposed to be separated from each other in the third direction (e.g. the Z-axis direction). However, the present invention is not limited thereto, and the pad region P3 may be in contact with the display region P1.

In this case, if the bending region P2 is bent, the substrate SUB of the bending region P2 may be folded in on itself. For example, in the bending region P2, an angle formed between the regions P1 and P3 may be between 0 and 90 degrees.

In the bending region P2, if the angle formed between the regions P1 and P3 is about 0 degrees, as described above, the display region P1 and the pad region P3 may be extended substantially parallel to each other and overlapped with each other.

Also, if the angle formed by the substrate SUB, as it is folded to face itself is about 0 degrees, the pad region P3 might not overlap the display region P1, but rather, the pad region P3 may overlap the part of the bending region P2. For example, the pad region P3 is disposed at the rear surface of the bending region P2, thereby the pad region P3 and the bending region P2 may be disposed to be parallel to each other.

Also, when the angle formed by the substrate SUB facing itself is greater than 0 degrees and less than 90 degrees, the pad region P3 may be obliquely disposed at the rear surface of the display region P1.

On the other hand, as the bending region P2 is bent, the angle formed by the display region P1 and the pad region P3 may be about 90 degrees. For example, the display region P1 and the pad region P3 may be disposed to be perpendicular to each other.

Alternatively, as shown in FIG. 2, according to exemplary embodiments of the present invention, the first width W of the bending region P2 may be formed to be narrower than the second width W2 of the pad region P3. The first width W1 and the second width W2 represent a length parallel to the first direction of the bending region P2 and the pad region P3. For example, the width of the pad region P3 where a plurality of pad terminals PAD is disposed and the width of the bending region P2 are formed to be different, and the width of the particularly pad region P3 is formed to be larger than the width of the bending region P2.

As described above, if the first width W1 of the bending region P2 is formed narrower than the second width W2 of the pad region P3, in the display device, the size of the bezel surrounding the display region P1 and/or the size of the case enclosing the surroundings of the display region P1 may be reduced. This will be described in detail with reference to FIG. 11.

Figure 11:
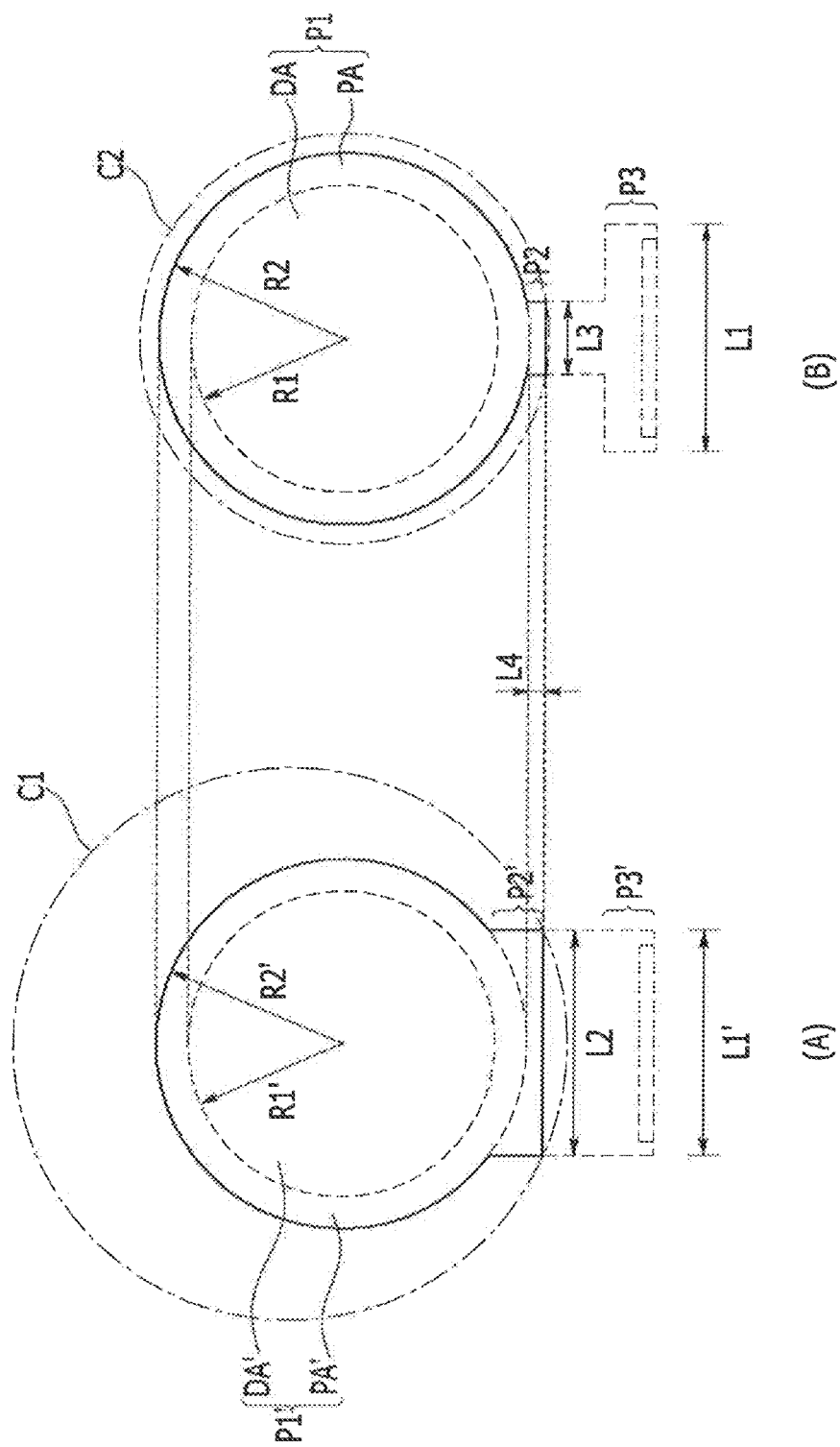
FIG. 11 is a view illustrating a size of a display device according to an exemplary embodiment of the present invention.

FIG. 11 is a view comparing a size of a display device according to an exemplary embodiment of the present invention.

Referring to FIG. 11, in the comparative example A, each size R1' and R2' of the display area DA' of the display area P1' and the periphery area PA' is semantically the same as each size R1 and R2 of the display area DA of the display region P1 and the periphery area PA in the present exemplary embodiment B (R1'=R1, R2'=R2). Also, the width L1' of the pad region P3' of the comparative example A and the width L1 of the pad region P3 of the present exemplary embodiment B are substantially the same.

Further, an interval L4 of the edge of the display area P1' and the edge of the bent bending region P2' in the comparative example A and the interval L4 of the edge of the display region P1 of the present exemplary embodiment B and the edge of the bent bending region P2 are substantially the same. For example, in the comparative example A and the present exemplary embodiment B, the bending regions P2 and P2' protrude from the edge of the display areas P1 and P1' to substantially the same size extent.

Alternatively, the width L2 of the bending region P2' of the comparative example A is formed to be larger than the width L3 of the bending region P2 of the present exemplary embodiment B.

Resultantly, in the comparative example A and the present exemplary embodiment B, the widths L2 and L3 of the bending regions P2 and P2' are different from each other, and the sizes of the rest of the display areas P1 and P1' and the pad regions P3 and P3' are all substantially the same.

In the comparative example A, it is assumed that a circular case C1 encloses the display device in which the pad region P3' is disposed at the rear surface of the display area P1'. Here, to enclose all of the bending region P2' within the case C1, an inner side of the circular edge of the case C1 may be in contact with both edges of the bending region P2' at a minimum.

Alternatively, in the present exemplary embodiment B, like the comparative example A, it is assumed that a circular case C2 encloses the display device in which the pad region P3 is disposed at the rear surface of the display area P1. Likewise, to enclose all of the bending region P2 within the case C2, the inner side of the circular edge of the case C2 may be in contact with both edges of the bending region P2 at a minimum.

In this case, as shown in FIG. 11, the minimum size of the circular case C1 of the comparative example A is formed to be larger than the minimum size of the circular case C2 of the present exemplary embodiment B. For example, when comparing the embodiment (the comparative example A) in which the width L2 of the bending region P2' is the same size as the width L1' of the pad region P3' with the embodiment (the present exemplary embodiment B) in which the width L3 of the bending region P2 is formed to be smaller than the width L1 of the pad region P3, the case C1 of the embodiment in which the width L2 of the bending region P2' is the same as the width L1' of the pad region P3' is formed larger.

Resultantly, like the present exemplary embodiment B, if the width L3 of the bending region P2 is smaller than the width L1 of the pad region P3, the size of the case C2 enclosing the display device may be reduced. Also, if the size of the case C2 is reduced, the size of the bezel of the display device may also be reduced.

Alternatively, in the present exemplary embodiment, the first width W1 of the bending region P2 may be formed to be constant. As shown in FIG. 2, the first width W1 is shown to be constant from the display region P1 toward the pad region P3.

Figure 12:
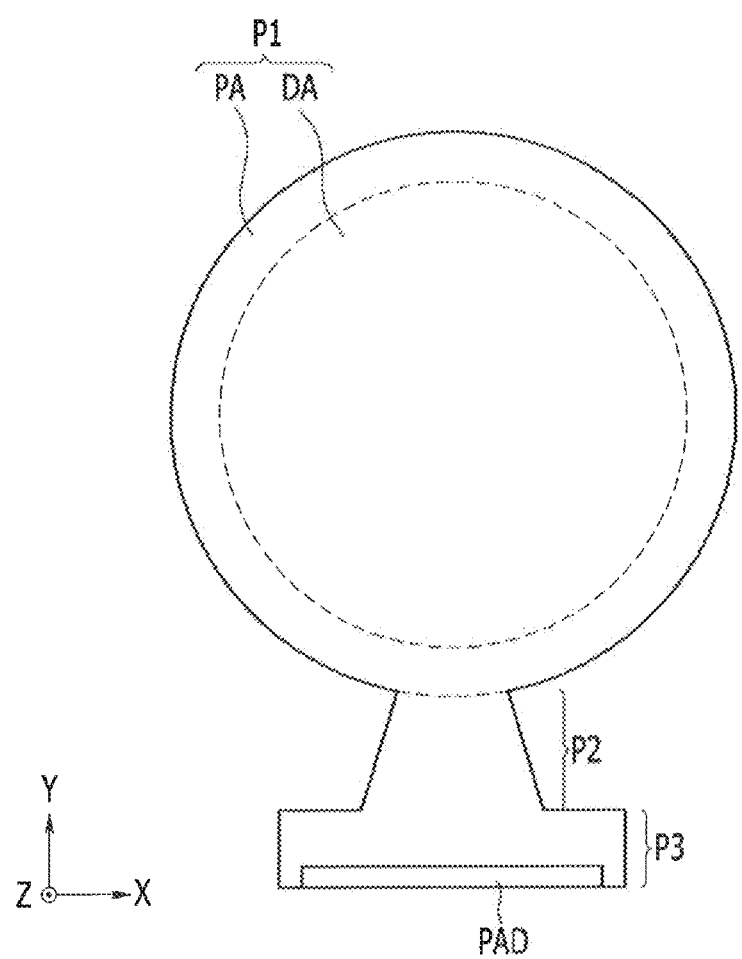
FIG. 12 to FIG. 15 are views illustrating variations of a bending region of FIG. 2 in accordance with exemplary embodiments of the present invention.
Figure 13:
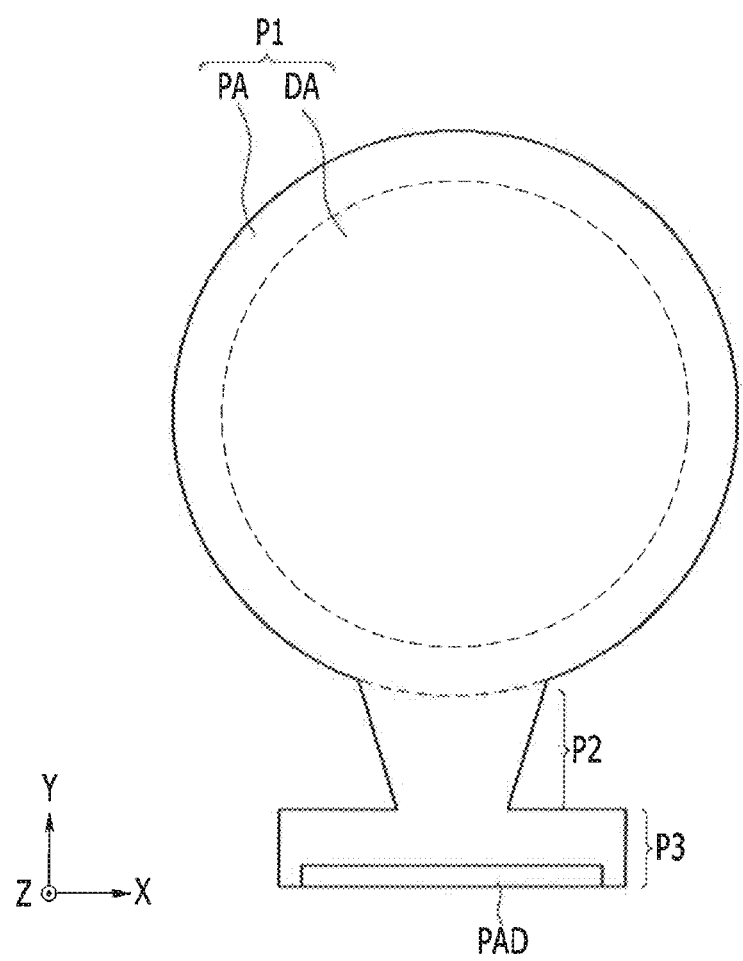

However, the present invention is not limited thereto, and the first width W1 of the bending region P2 may have various shapes as shown in FIG. 12 to FIG. 15. For example, as shown in FIG. 12, the first width W1 of the bending region P2 may be increased from the display region P1 toward the pad region P3. In contrast, as shown in FIG. 13, the first width W1 of the bending region P2 may be decreased from the display region P1 toward the pad region P3.

Figure 14:
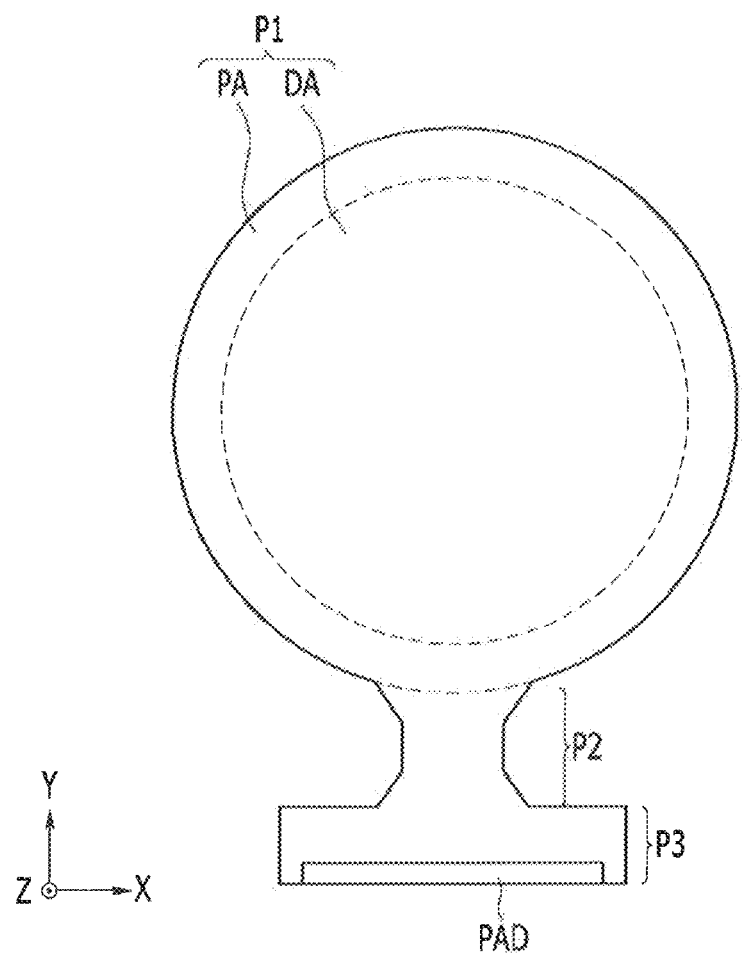
Figure 15:
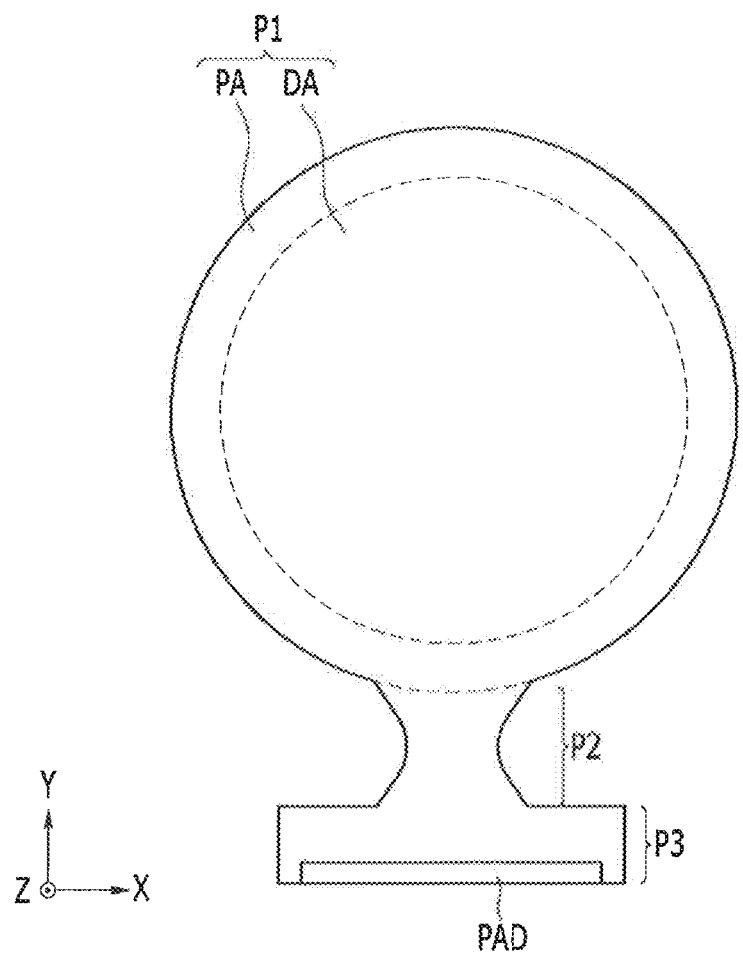

Further, as shown in FIG. 14 and FIG. 15, the first width W1 of the bending region P2 may be decreased and then increased from the display region P1 toward the pad region P3. For example, the bending region P2 may have a shape in which the width of a center part is smaller than that of both ends of the bending region P2. However, in FIG. 14, one side of the edge of the bending region P2 may be disposed in a straight line, while in FIG. 15, one side of the edge of the bending region P2 may be disposed in a curve. In contrast, the first width W1 of the bending region P2 may be increased, and then decreased from the display region P1 to the pad region P3.

Again referring to FIG. 4, a plurality of connection wires CL may be disposed in the bending region P2. As described above, a plurality of connection wires CL may be connected to the plurality of signal lines and may extend from the periphery area PA to the pad region P3 through the bending region P2. Also, the plurality of connection wires CL may be connected to the plurality of pad terminals PAD of the pad region P3. For example, a clock signal is transmitted through the plurality of pad terminals PAD from an external source, and the transmitted clock signal may be transmitted to the scan circuit that may be disposed in the display region P1 through the plurality of connection wires CL.

According to an exemplary embodiment of the present invention, adjacent connection wires among the plurality of connection wires CL of the bending region P2 may be disposed at different layers. Referring to FIG. 5, the first connection wire G1 and the second connection wire G2 adjacent to each other among the plurality of connection wires CL may be formed within different layers.

Alternatively, referring to FIG. 6 and FIG. 7, when the first connection wire G1 and the second connection wire G2 are formed at the different layers, either the first connection wire G1 or the second connection wire G2 may be connected to either the first pad terminal PAD1 or the second pad terminal PAD2 through a contact hole CT.

For example, the first pad terminal PAD1 and the second pad terminal PAD2 adjacent to each other among the plurality of pad terminals PAD may be formed as part of the same layer. For example, the first pad terminal PAD1 and the second pad terminal PAD2 may be formed of the same metal. Further, the first pad terminal PAD1 and the second pad terminal PAD2 may be disposed at the same positions, and for example, may be disposed on the insulating layer and separated from each other.

In addition, the first connection wire G1 may be formed from a different layer than the first pad terminal PAD1. For example, the second insulating layer GI2 may be disposed between the first connection wire G1 and the first pad terminal PAD1. According to an exemplary embodiment of the present invention, the first connection wire G1 and the first pad terminal PAD1, that are disposed within different layers, may be electrically connected through the contact hole CT formed in the second insulating layer GI2.

Alternatively, the second connection wire G2 may be formed within the same layer as the second pad terminal PAD2. For example, the second connection wire G2 and the second pad terminal PAD2 may be formed of the same metal and within the same layer.

The first connection wire G1 and the second connection wire G2 are sequentially disposed on the substrate SUB. For example, the second insulating layer GI2 may be interposed between the first connection wire G1 and the second connection wire G2. The first insulating layer GI1 may be disposed between the substrate SUB and the first connection wire G1.

According to an exemplary embodiment of the present invention, the first insulating layer GI1, the second insulating layer GI2, and the third insulating layer ILD, each disposed on the bending region P2, may be organic layers. For example, the first insulating layer GI1, the second insulating layer GI2, and the third insulating layer ILD may each be formed of the organic layer. By forming the first insulating layer GI1, the second insulating layer GI2, and the third insulating layer ILD of the organic layer, that is relatively soft compared with an inorganic layer, on the bending region P2, fewer cracks may be generated in the insulating layer of the bending region P2.

However, according to exemplary embodiments of the present invention, the first insulating layer GI1, the second insulating layer GI2, and the third insulating layer ILD, disposed on the bending region P2, are each formed of the organic layer. However, the present invention it is not limited to this particular arrangement, and at least one of the first insulating layer GI1, the second insulating layer GI2, and the third insulating layer ILD, may be formed of the organic layer. For example, only one of the first insulating layer GI1, the second insulating layer GI2, and the third insulating layer ILD) might be formed of the organic layer, or only two layers thereof may be formed of the organic layer.

According to an exemplary embodiment of the present invention, the first connection wire G1 may be formed within the same layer as the first gate wire GW1 of the display panel 100. Further, the second connection wire G2 may be formed of the second gate wire GW2 of the display panel 100.

When the first connection wire G1 and the second connection wire G2 are formed within the same layer, if an interval between the first connection wire G1 and the second connection wire G2 is decreased, a possibility of the first connection wire G1 and the second connection wire G2 being short-circuited is increased. Moreover, the extent to which the interval of the first connection wire G1 and the second connection wire G2 can be reduced may be further limited by the limitations of the etching process.

However, according to exemplary embodiments of the present invention, as the first connection wire G1 and the second connection wire G2 are formed within different layers, a second interval T2 of the first connection wire G01 and the second connection wire G2 may be minimized. For example, even if the second interval T2 of the first connection wire G1 and the second connection wire G2 is reduced, the possibility of the first connection wire G1 and the second connection wire G2 of the different layers being short-circuited is decreased. Further, if the second interval T2 between the first connection wire G1 and the second connection wire G2 is minimized, the width of the bending region P2 where the plurality of connection wires CL are disposed may be reduced. Also, the second interval T2 between the first connection wire G1 and the second connection wire G2 may be minimized such that a density of the connection wire may be increased.

However, as shown in FIG. 8, the plurality of connection wires G3 may each be formed within the same layer. In this case, each line width of the plurality of connection wires G3 may be formed to be smaller than each line width of the plurality of connection wires G1 and G2 of FIG. 5. By decreasing the line width of the plurality of connection wires G3 like the case in which the plurality of connection wires G1 and G2 are formed with the different layers, the width of the bending region P2 may be reduced.

According to an exemplary embodiment of the present invention, the first connection wire G1 and the second connection wire G2 are formed as two distinct layers, however they may alternatively be formed as three, four, or more distinct layers.

Referring to FIG. 4, a plurality of pad terminals PAD may be disposed in the pad region P3. In this case, the pad region P3 may have a plane shape of a quadrangular shape.

According to an exemplary embodiment of the present invention, the first interval T1 between the first pad terminal PAD1 and the second pad terminal PAD2 adjacent to each other among the plurality of pad terminals PAD may be formed to be larger than the second interval T2 between the first connection wire G1 and the second connection wire G2. Resultantly, when viewed on a plane, the plurality of connection wires CL may be disposed more densely than the plurality of pad terminals PAD. In this case, the first interval T1 may be formed to be larger than the second interval T2 by a factor of about 2 to 4.

Alternatively, referring to FIG. 2, the flexible circuit board 400 may be bonded to the plurality of pad terminals PAD. The flexible circuit board 400 may be mounted with the first driving chip 410 used to drive the display panel 100. In this case, the flexible circuit board 400 may be a chip-on-film (COF) board.

The flexible circuit board 400 may be of a type in which a plurality of metal wires are formed on a flexible base film.

The first driving chip 410 may be mounted to the base film to generate the driving signal. For example, the first driving chip 410 may be the scan driving circuit generating the scan signal or the data driving circuit generating the data signal by receiving the control signal from an external source. For example, the above-described gate driver 210 or data driver 230 may be formed in the first driving chip 410.

According to an exemplary embodiment of the present invention, the flexible circuit board 400 of the COF type is bonded to the pad region P3, or alternatively, a second driving chip 500 of the COG type or the COP type may be disposed in the pad region P3. For example, the second driving chip 500 may be mounted to the pad region P3.

Figure 16:
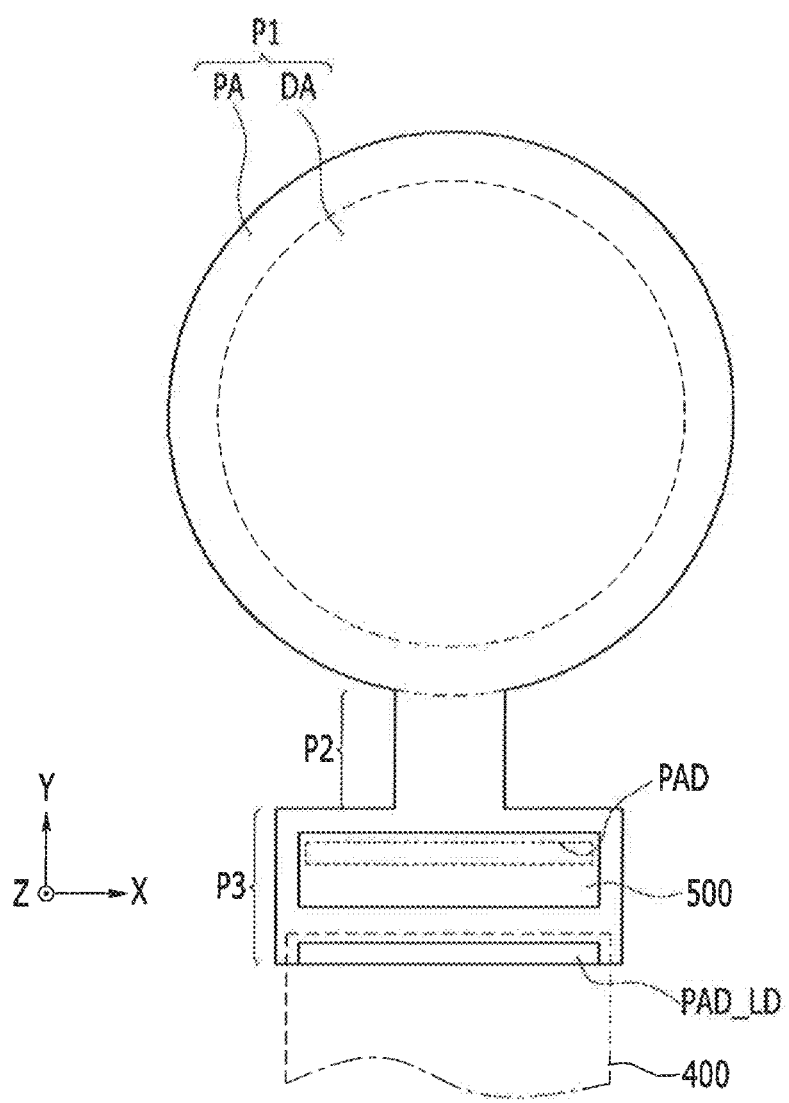
FIG. 16 is a view illustrating a variation of a pad region of FIG. 1 in accordance with exemplary embodiments of the present invention.

Referring to FIG. 16, the second driving chip 500, like the first driving chip 410, may be the scan driving circuit generating the scan signal and the data driving circuit generating the data signal by receiving the control signal from an external source. For example, the above-described gate driver 210 or data driver 230 may be formed in the second driving chip 500.

In this case, the second driving chip 500 may be disposed in the pad region P3, and the second driving chip 500 may be bonded with the plurality of above-described pad terminals PAD. Further, a plurality of lower pad terminals PAD_LD bonded with the flexible circuit board 400 may be disposed on a lower end of the pad region P3. For example, the second driving chip 500 may be connected to the plurality of lower pad terminals PAD_LD through separate wiring formed in the pad region P3.

In the display device according to an exemplary embodiment of the present invention, the first width W1 of the bending region P2 is formed to be narrower than the second width W2 of the pad region P3, thereby reducing the size of the bezel occupying the periphery of the display region P1 and/or reducing the size of the case that encloses the periphery of the display region P1 in the display device.

While this invention has been described in connection with what is presently considered to be practical exemplary embodiments, it is to be understood that the invention is not limited to the disclosed embodiments, but, on the contrary, is intended to cover various modifications and equivalent arrangements.

What is claimed is:

1. A display device comprising:
    a single, unitary substrate including a first region in which an image is displayed, a second region in which an image is not displayed, and a bending region being configured to bend along a bending axis which extends in a first direction;
    a display panel disposed in the first region including a plurality of signal lines; and
    a plurality of pad terminals disposed within the second region and electrically connected to the plurality of signal lines,
    wherein a first width of the bending region, at its widest point, in the first direction, is narrower than a second width of the second region in the first direction, and
    wherein an edge of the first region has a non-flat portion at a position adjacent to the bending region.

2. The display device of claim 1, wherein the first region has a rounded edge in a portion adjacent to the bending region.

3. The display device of claim 1, wherein the bending region is bent such that the second region overlaps the first region.

4. The display device of claim 1, wherein the bending region is bent such that the substrate of the bending region faces itself.

5. The display device of claim 1, wherein the bending region is bent such that the first region and the second region are perpendicular to each other.

6. The display device of claim 1, wherein the first width of the bending region is substantially identical over the entirety of the bending region.

7. The display device of claim 1, wherein the first width of the bending region is smaller at a central area between the first region and the second region than at both an area that is closer to the first region and at an area that is closer to the second region.

8. The display device of claim 1, wherein the first width increases and then decreases from the first region toward the second region.

9. The display device of claim 1, wherein the first region has a substantially circular shape.

10. The display device of claim 1, wherein the first region has a substantially oval shape.

11. The display device of claim 1, further comprising:
    a plurality of signal lines disposed within the first region; and
    a plurality of connection wires disposed within the bending region and connecting the plurality of signal lines to the plurality of pad terminals.

12. The display device of claim 11, wherein:
    the plurality of connection wires includes a first connection wire and a second connection wire adjacent to the first connection wire, and
    the first connection wire and the second connection wire are disposed within a same layer.

13. The display device of claim 11, wherein the plurality of connection wires is disposed within a plurality of layers.

14. The display device of claim 1, wherein the plurality of signal lines transmits a scan signal or a data signal.

15. The display device of claim 1, further comprising a flexible circuit board bonded with the plurality of pad terminals and disposed with a first driving chip on one surface.

16. The display device of claim 15, further comprising a second driving chip disposed within the second region and electrically connected to the plurality of pad terminals.

17. The display device of claim 1, wherein a plurality of organic light emitting elements are disposed within the first region.

18. The display device of claim 1, wherein the second region has a substantially quadrangular shape.

19. The display device of claim 1, wherein the first region has a substantially quadrangular shape.

20. The display device of claim 1, wherein an image is displayed in the first region.

21. A display device comprising:
    a single, unitary substrate including a first region in which an image is displayed, a second region in which an image is not displayed, and a bending region being configured to bend along a bending axis which extends in a first direction;
    a display panel disposed within the first region including a plurality of signal lines;
    a plurality of pad terminals disposed within the second region and electrically connected to the plurality of signal lines;
    a plurality of signal lines disposed within the first region; and
    a plurality of connection wires disposed within the bending region and connecting the plurality of signal lines to the plurality of pad terminals,
    wherein a first width of the bending region, at its widest point, in the first direction, is narrower than a second width of the second region in the first direction, and
    wherein a first connection wire and a second connection wire, among the plurality of connection wires, are adjacent to each other and are disposed within different layers.

22. The display device of claim 21, wherein an insulating layer is interposed between the first connection wire and the second connection wire.

23. The display device of claim 22, wherein:
    the plurality of pad terminals includes a first pad terminal and a second pad terminal that is adjacent to the first pad terminal;
    the first pad terminal is electrically connected to the first connection wire; and
    the second pad terminal is electrically connected to the second connection wire.

24. The display device of claim 23, wherein the first pad terminal and the second pad terminal are disposed within a same layer.

25. The display device of claim 24, wherein:
    the first pad terminal is disposed within a different layer from the first connection wire, and
    the second pad terminal is disposed within a same layer as the second connection wire.

26. The display device of claim 25, wherein the first pad terminal is electrically connected to the first connection wire through a contact hole formed in the insulating layer.

27. The display device of claim 22, wherein the insulating layer includes an organic layer.

28. The display device of claim 21, wherein:
    the plurality of pad terminals includes at least a first pad terminal and a second pad terminal that is adjacent to the first pad terminal, and a first interval between the first pad terminal and the second pad terminal is larger than a second interval between the first connection wire and the second connection wire.

29. The display device of claim 28, wherein the first interval is between two and four times that the second interval.

30. A display device comprising:
a substrate including a first region in which an image is displayed, a second region in which an image is not displayed, and a bending region being configured to bend along a bending axis which extends in a first direction; and
a plurality of pad terminals disposed within the second region,
wherein a first width of the bending region in the first direction, is narrower than a second width of the second region in the first direction,
wherein the first width of the bending region is larger at an area closer to the second region than at an area closer to the first region.

31. A display device comprising:
a substrate including a first region in which an image is displayed, a second region in which an image is not displayed, and a bending region being configured to bend along a bending axis which extends in a first direction; and
a plurality of pad terminals disposed within the second region,
wherein a first width of the bending region in the first direction, is narrower than a second width of the second region in the first direction,
wherein the first width of the bending region is smaller at an area closer to the second region than at an area closer to the first region.

* * * * *